(12) United States Patent
Voldman

(10) Patent No.: US 7,821,099 B2
(45) Date of Patent: Oct. 26, 2010

(54) STRUCTURE FOR LOW CAPACITANCE ESD ROBUST DIODES

(75) Inventor: Steven H. Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 234 days.

(21) Appl. No.: 12/118,875

(22) Filed: May 12, 2008

(65) Prior Publication Data

US 2008/0251846 A1 Oct. 16, 2008

Related U.S. Application Data

(62) Division of application No. 09/683,985, filed on Mar. 8, 2002, now Pat. No. 7,384,854.

(51) Int. Cl.
*H01L 29/861* (2006.01)

(52) U.S. Cl. .................. 257/516; 257/594; 257/605; 257/E27.016

(58) Field of Classification Search .......... 257/46, 257/603, 604, 605, 606, 501, 502, E27.016, 257/516, 594
See application file for complete search history.

(56) References Cited

U.S. PATENT DOCUMENTS

| | | | |
|---|---|---|---|
| 4,454,647 A * | 6/1984 | Joy et al. ............... | 438/361 |
| 4,736,271 A | 4/1988 | Mack et al. | |
| 5,430,311 A | 7/1995 | Murakami et al. | |
| 5,446,303 A | 8/1995 | Quill et al. | |
| 5,623,156 A | 4/1997 | Watt | |
| 5,629,544 A | 5/1997 | Voldman et al. | |
| 5,691,557 A | 11/1997 | Watanabe | |
| 5,731,941 A | 3/1998 | Hargrove et al. | |
| 5,825,067 A | 10/1998 | Takeuchi et al. | |
| 5,841,169 A | 11/1998 | Beasom | |
| 5,945,713 A | 8/1999 | Voldman | |
| 5,994,760 A | 11/1999 | Duclos | |
| 6,011,420 A | 1/2000 | Watt et al. | |
| 6,015,999 A * | 1/2000 | Yu et al. ............... | 257/497 |
| 6,072,219 A | 6/2000 | Ker et al. | |
| 6,081,002 A | 6/2000 | Amerasekera et al. | |
| 6,190,954 B1 | 2/2001 | Lee et al. | |
| 6,191,455 B1 | 2/2001 | Shida | |
| 6,242,763 B1 | 6/2001 | Chen et al. | |
| 6,274,910 B1 | 8/2001 | Yu | |
| 6,437,383 B1 | 8/2002 | Xu | |
| 6,534,366 B2 * | 3/2003 | Korec et al. ............ | 438/270 |
| 6,646,297 B2 * | 11/2003 | Dennison ............... | 257/296 |

FOREIGN PATENT DOCUMENTS

JP 63042217 2/1988

* cited by examiner

*Primary Examiner*—Jerome Jackson, Jr.
*Assistant Examiner*—Paul A Budd
(74) *Attorney, Agent, or Firm*—Anthony J. Canale

(57) ABSTRACT

A diode having a capacitance below 0.1 pF and a breakdown voltage of at least 500V. The diode has an anode of a first conductivity type and a cathode of a second conductivity type disposed below the anode. At least one of the cathode and anode have multiple, vertically abutting diffusion regions. The cathode and anode are disposed between and bounded by adjacent isolation regions.

25 Claims, 7 Drawing Sheets

STRUCTURE FOR LOW CAPACITANCE ESD ROBUST DIODES

This application is a divisional of U.S. patent application Ser. No. 09/683,985, filed on Mar. 8, 2002, now U.S. Pat. No. 7,384,854.

BACKGROUND OF THE INVENTION

Technical Field

The invention relates to ESD diodes.

ESD diodes are well known in present day semiconductor technology in order to protect I/O and other eternal circuitry from electostatic discharges (ESD) and other overvoltage conditions that could cause catastrophic failure in integrated circuits. See e.g. U.S. Pat. No. 5,629,544 to Voldman et al., "Semiconductor Diode with Silicide Films and Trench Isolation," which teaches ESD diodes having silicided electrodes to reduce series resistance, and U.S. Pat. No. 5,945,713 to Voldman, "Electrostatic Discharge Protection Circuits for Mixed Voltage Interface and Multi-Rail Disconnected Power Grid Applications," which teaches an ESD diode that can interface with multiple supply voltages.

Because of high sheet resistance, these ESD diodes must be made large in order to discharge the ESD currents. However, in a CMOS technology, this also leads to an increase in the capacitance per unit area which is acceptable for CMOS technologies below 1 Ghz application frequencies but not for application speeds above this frequency range. Large ESD structures are also unacceptable for high speed RF applications due to the high capacitance load placed on the RF circuit. U.S. Pat. No. 4,734,271 to Mack et al., "Protection Device Utilizing One or More Subsurface Diodes and Associated Method of Manufacture," teaches ESD diodes vertically formed in the substrate. As shown in FIGS. 4A and 4B of this patent, the pn junctions 46 and 56, respectively, are buried beneath the surface of the substrate. Such structures are used to reduce total surface area consumed by the ESD device. U.S. Pat. No. 5,825,067 to Takeuchi et al., entitled "Dielectrically Isolated IC Merged with Surge Protection Circuit and Method For Manufacturing the Same" teaches forming a simple ESD diode in a well region completely isolated from the substrate. Such an arrangement improves latchup immunity because the device is physically completely isolated from the substrate, at the expense of extra processing steps and complexity associated with providing such complete isolation.

As integrated circuit (IC) switching speeds improve, it is important to provide ESD diodes with high Quality factors, known as "Q". The Q factor in an ESD diode is a function of the capacitance and the diode series resistance. For ESD robustness and a high Q factor, it is important to provide an ESD element which has a minimum of diode resistance and inductance.

As circuits increase in switching speed, it is important that the reactance remains a constant. The reactance is equal to the product of the application frequency and capacitance. Hence, there is a need in the art for an ESD diode that can be scaled to lower capacitance as the frequency of the application increases from 1 Ghz to 1000 Ghz.

For RF and high speed applications, it is also important that ESD networks do not generate noise. Noise injected into the substrate can affect analog and RF circuitry. Noise generation which occurs in the ESD network can lead to functional misoperation of analog and RF circuits. Hence, there is a need in the art for an ESD networks that prevent noise injection into adjacent analog or RF circuitry.

For RF and high speed applications, high resistive substrates are used to avoid noise coupling between digital and analog circuitry. Using low doped substrates leads to an increase in the latchup sensitivity of a technology. Latchup occurs when a negative resistance condition is established leading to a low voltage high current state. Latchup can be destructive to a semiconductor chip. Latchup typically occurs because of triggering of a pnpn structure. Current injection from overshoot or undershoot phenomenon can lead to triggering latchup. Hence, there is a need in the art for an ESD element that do not enhance the latchup sensitivity of a technology.

For analog, RF and power applications, thermal properties of a semiconductor device, isolation structure and its geometrical design can significantly influence the ESD robustness of an ESD structure. Self heating occurs in semiconductors as a result of the power in the structure. The temperature in a ESD device can be estimated as equal to the product of the power and the thermal impedance. The thermal impedance is analog of the electrical impedance which is a function of the thermal conductivity to the substrate, cross sectional area and distance to the substrate region. Hence, there is a need in the art for an ESD structures to provide an ESD device which achieves a low thermal impedance to minimize self heating and failure of an ESD structure.

As integrated circuit (IC) switching speeds approach and pass 1 GHz, there is a need to reduce the capacitance of ESD diodes. This is because as switching speeds increase, device area decreases, such that device reactance remains relatively constant. As capacitance decreases we want to avoid compromising the ESD robustness (that is, the breakdown voltage) of the diode. In general these goals have been mutually exclusive; ESD robustness is typically preserved by making the diode structure fairly large, which drives up capacitance.

BRIEF SUMMARY OF THE INVENTION

It is thus an object of the present invention to provide an ESD diode that has reduced capacitance.

It is another object of the present invention to provide an ESD diode that is scalable for successively increasing application frequencies.

It is a further object of the present invention to provide an ESD diode that has low thermal impedance.

It is yet another object of the present invention to provide an ESD diode that minimizes noise injection.

It is yet another object of the present invention to provide an ESD diode that is latchup tolerant and does not compromise the latchup sensitivity of the technology.

The foregoing objects of the present invention are realized by, in a first aspect, a diode formed on a semiconductor substrate having transistors formed therein with switching speeds in excess of 1 GHz, said diode having a capacitance below 0.1 pF and an ESD HBM robustness above 500V.

In another aspect, the invention comprises a diode formed in a substrate having isolation regions, comprising an anode of a first conductivity type and a cathode of a second conductivity type disposed below said anode and in electrical contact with said substrate, wherein at least one of said cathode and anode comprise a plurality of vertically abutting diffusion regions, and wherein said cathode and anode are disposed between and bounded by adjacent isolation regions.

BRIEF DESCRIPTION OF THE SEVERAL VIEWS OF THE DRAWINGS

The foregoing and other features of the invention will become apparent upon review of the detailed description of the present invention as rendered below. In the description to follow, reference will be made to the various figures of the accompanying Drawing, in which.

DETAILED DESCRIPTION OF THE INVENTION

A fundamental observation underlying the invention is that the capacitance of ESD diodes must decrease with decreasing device sizes, in order to support high switching speeds for the devices protected by the diode. This observation is not intuitive; rather, it flows from the implications of the Johnson Limit.

A fundamental relationship exists between the frequency response of the transistor and the maximum power applied across a transistor. This is known as the Johnson Limit. The Johnson Limit in its power formulation is given as:

$$(P_m X_c)^{1/2} f_T = E_m v_s / 2\pi$$

where Pm is the maximum power, XC is the reactance Xc=½P T Cbc, fT is the unity current gain cutoff frequency, Em is the maximum electric field and vs is the electron saturation velocity. The Johnson Limit indicates that there is an inverse relationship between the maximum power and frequency response.

From the ratio of the power to failure condition and the maximum power vs fT relationship, a dimensionless group can be established explaining the relationship between thermal conduction, thermal capacity, failure temperature, pulse width, saturation velocity, maximum electric field condition and the unity current gain cutoff frequency. Defining a dimensionless group Vo, $$Vo = \frac{Power\ to\ failure}{Johnson\ Limit\ Maximum\ Power} = \frac{P_f(\tau)}{P_m}$$

This dimensionless group is suitable for an epitaxial base SiGe HBT device and the Johnson Limit maximum power expression for a transistor. In the thermal diffusion time regime, we can express dimensionless group Vo as $$Va = \frac{P_f}{P_m} = \frac{A\sqrt{\frac{\pi K C_{p\rho}(T-To)}{\tau}}}{\frac{\left(\frac{E_m^2 v_s^2}{(2\pi)^2}\right)}{X_c f_T^2}}$$

From this expression, it is clear that as the cutoff frequency of the transistor increases, the reactance of the transistor must be reduced to maintain the same maximum power condition. As such the capacitance of support devices such as ESD diodes must also decrease.

Figure 1:
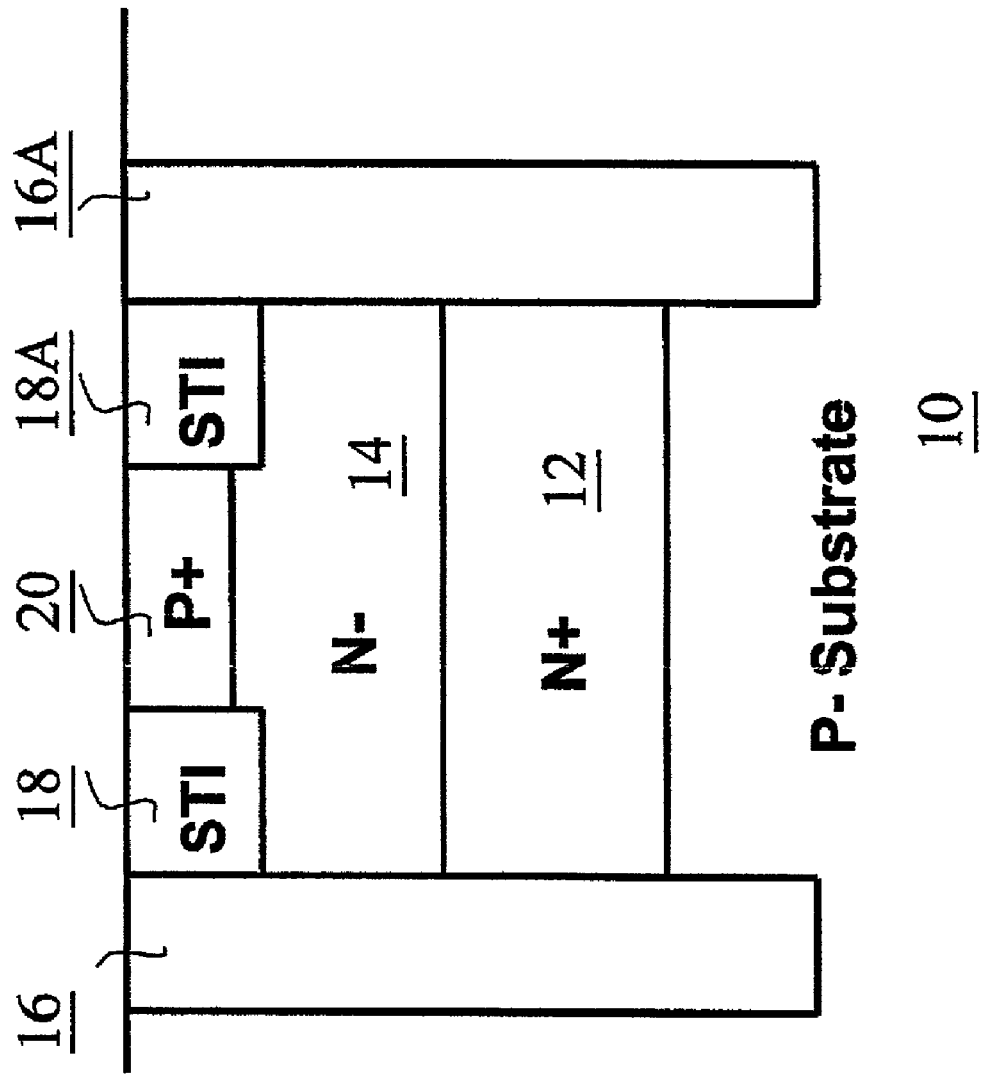
FIG. 1 is a cross-sectional view of an ESD diode in accordance with a first embodiment of the present invention.

With reference to FIG. 1, in a first embodiment of the invention, an ESD diode is shown that is formed in a p-silicon substrate 10. Other semiconducting substrates (such as silicon germanium, silicon-carbon-germanium, gallium arsenide) could be used that are compatible with the process set forth below. A deep n+ region 12 is first formed, by implanting phosphorous ions at a concentration of 1 times 10 to the 14th power per square centimeter (abbreviated hereafter as 1×10e14/cm2) to 1×10e16/cm2, and an energy of 800 thousand electron volts (abbreviated hereafter is kEV). Other concentration densities and implant energies could be used. dose ranges can vary from 1×10e14/cm2 to 1×10e16/cm2 and energy levels can vary from 400 keV to 1 MeV. Then a more shallow n-region 14 is formed by epitaxially growing silicon up from the n+doped region 12. Alternately the n− region 14 could be formed by a separate implant at a lower dose and energy. The lower doped region can be formed without epitaxial growth using the region 12 as an implant without epitaxial growth. The substrate 10 is subsequently masked and etched in a chlorine-based reactive ion etch (RIE) to form deep trenches 16, 16A. In practice, for 0.18 um groundrule technology, the trenches would be 5.5 microns deep; the trenches would be more shallow for technologies of lower groundrules. Other depths/widths could be used, so long as the resulting trenches extend below the junction between the n+ region 12 and the substrate 10. In the case of an implanted region 12, the region can be shallower. By providing a shallower region 12, the depth of the trench region could be reduced to avoid increases in the thermal resistance of the diode structure. For deep trenches, the trench structures need to be lined with an insulator whose material properties do not lead to dislocations and material cracking of the silicon. Hence the region must not be wide or must be filled with a second material having a thermal expansion coefficient that does not lead to silicon damage. Materials such as polysilicon, or glasses, such as PSG or BPSG, can be used to fill the deep trench structures and other known materials used in DRAM trench structures or high performance bipolar transistors known in the art. The materials must not absorb ionics. The thickness of the insulator in the trench structure must be chosed to avoid capacitance increases as well as depletion effects on the sidewall. Hence dielectric thicknesses significantly greater than node dielectrics are chosen. The dielectric must be greater than 100 Angstroms to avoid capacitance increase. For isolation region 18 and 18A, trenches are filled with silicon oxide (e.g. by deposition of TEOS followed by an etchback process such as chemical-mechanical polishing), a p+ ion 20 is formed atop the n− region 14, by implanting boron ions at a concentration of used in MOSFET source drain regions. This region can be a MOSFET source/drain implant, or an extension implant, such as 1×10e17/cm2 and an energy of 70 kEV but not limited to the dose or energy. As shown in FIG. 1, the structure preferably includes shallow trench isolation (STI) 18 on either side of the p+ region 20, such that the p−n junction between p+ region 20 and n− region 14 is within the area bounded by the isolation regions 18 and 18A. In this structure, a p+/n−/n+ diode structure is formed. Additionally, the formation of the metallurgical junctions are placed well below the structure surface to avoid salicide related ESD failure mechanisms near the junction edge.

One feature of the invention is these structures are entirely compatible with the steps used to form a bipolar transistor. The n+ region 12 could be formed at the same time as the buried subcollector for a bipolar transistor; the n− region 14 could be formed as part of the epitaxial growth for the bipolars. The p+ region would be formed using a MOSFET source/drain. In practice, this diode would in fact be formed using these steps to minimize process complexity and expense.

A second feature of this invention is that the region 14 which is bound by trench isolation could be of the opposite doping polarity (p− instead of n−). In this case, the region n− dopants are either blocked or compensated to form a p− region. In the case of the region 14 being of a p− dopant, the dopant can be achieved by a CMOS p-well which compensates a bipolar n− epitaxial doping. Another method of forming region 14 as p− dopants would be implantation of an additional implant. In this case, the embodiment would form a p+/p−/n+ diode structure. Additionally, the formation of the metallurgical junctions are placed well below the structure surface to avoid salicide related ESD failure mechanisms.

In general, anode regions for the diodes of the invention can be formed by p+ source/drain implants used for CMOS transistors or p+ base regions used for bipolar transistors. Epitaxial films can be deposited on the silicon wafer to form anode structures in the P+ diode structures. Using ultrahigh vacuum chemical vapor deposition (UHV/CVD) or other chemical vapor deposition processes, the anode region can be deposited on the silicon wafer containing the cathode region. The anode region may contain Silicon, Silicon Germanium, Silicon Germanium Carbon, or III-V compounds (e.g. GaAs, InP, etc). Using eptixial regions, compound semiconductors and heterojunctions can be used to provide low capacitance diode structures. Heterojunctions allow for the ability to modulate the bandgap of a junction to provide a low capacitance junction at a metallurgical junction. This enables to allow for a low resistance for doping in one physical region without impacting the capacitance of a junction and providing low resistance in another region. Homojunctions used for ESD diodes can allow for optimization of the diode structure to allow for a low capacitance junction and a low electrical resistance and low thermal impedance. "Double heterojunction bipolar transistors (DHBT) devices allow for the formation of a heterojunction at an emitter-base junction as well as a base-collector junction.

The resulting diode is superior to standard ESD diode structures because the deep trench isolation improves latchup tolerance and prevents lateral injection to adjacent structures, in that the diffusions are disposed between and are bounded by the isolation-filled trenches. The structure also provides a minimum of noise injection to adjacent circuitry. A low sidewall capacitance at the deep trench-silicon interface at the anode-cathode junction is a result of the insulator at the trench sidewall. This provides for a low perimeter capacitance which is lower than the area capacitance term of the diode structure. In the case where region 14 is p− doped, the junction is formed between region 14 and region 12. This provides a low capacitance junction with a trench perimeter. The trench perimeter forms a low capacitance perimeter. Also note that the lower portion of the region 12 forms a junction with the substrate 10 that is above the lower portions of the isolation-filled trenches. Heavily doped region 12 provides low diode series resistance vertically and laterally. As such, the isolation also improves both lateral and vertical capacitance. A feature of this structure is that its capacitance value can be scaled as a function of the process technology, and has been shown by modelling to be scalable from above 1 pico Farad (pF) down to approximately 0.01 pF. At the same time, modelling of these structures has indicated that ESD robustness (that is, diode breakdown voltage, or HBM), while also scaling, still stays at a high enough value to provide the requisite ESD protection. A 1 pF ESD diode constructed in accordance with the invention would have a ESD HBM of 10,000 V; a 0.1 pf diode would have a ESD HBM of 4000 V; and a 0.01 pF diode would have an ESD HBM of less than 1000 V. As such, the ESD diode of the invention has a high ratio of ESD power-to-failure per pF of capacitance, which is particularly important for high switching speed applications.

Figure 2:
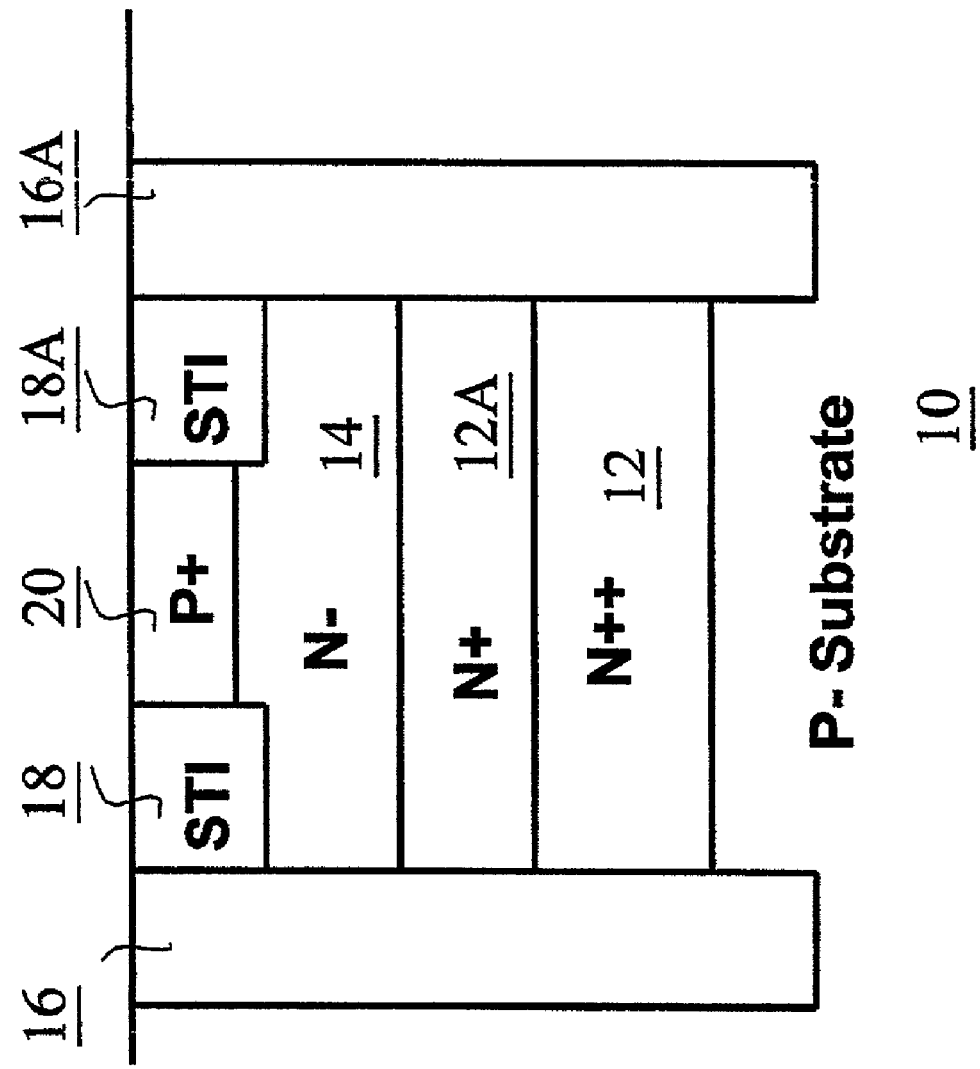
FIG. 2 is a cross-sectional view of an ESD diode in accordance with a second embodiment of the present invention.

FIG. 2 illustrates a second embodiment of the present invention. In FIG. 2, reference numerals that are the same as those used in FIG. 1 refer to structures that are the same as those depicted and described with reference to FIG. 1 (note, this also holds true for the remaining embodiments of the invention as set forth below). FIG. 2 shows the addition of n+ implant region 12A. As a practical matter this structure would be formed at the same time as the n-well implant when forming a BiCMOS device (i.e. the well region for the PFETs), and is typically a retrograde implant that is more heavily doped in its lower portions and more lightly doped in its upper portions. In the case of a BiCMOS n-well implant, n-well implants can consist of a plurality of implants at different energies and doses to tailor the body effect of a MOSFET transistor. Hence, region 14 can consist of the deep retrograde well implant, the "fill implant" and PFET well optimization implants used to optimize the MOSFET p-channel device. Likewise, this implant can also be a "pedestal implant" used for the high speed bipolar transistors. The pedestal implant is typically used for reduction of the Kirk effect. In BiCMOS technologies, a plurality of pedestal implants are placed in the collector opening of the bipolar device. These implants can be placed into the diode structure in FIG. 2 to form the structure disclosed. The implant region 12A would be formed after the n− region 14 is grown. This implant region further reduces the lateral and vertical resistance of the structure. By providing a low doped region near the junction implant and heavily doped region below, the structure has a low junction capacitance at the anode-cathode junction, a low electrical resistance and low thermal resistance to the substrate. Additionally, minority carrier recombination occurs in the cathode region in the heavily doped region. This provides low injection to the substrate and low minority carrier storage time in the diode structure. Additionally, the formation of the metallurgical junctions are placed well below the structure surface to avoid salicide related ESD failure mechanisms.

In FIG. 2, as previously discussed, the region 14 can be the p− doped. In that case, the metallurgical junction is formed between region 14 and 12A. In this case, a p+/p−/n−/n+ diode structure is formed. The junction formed between region 14 and region 12A is isolation bounded providing a low capacitance diode structure.

Figure 3:
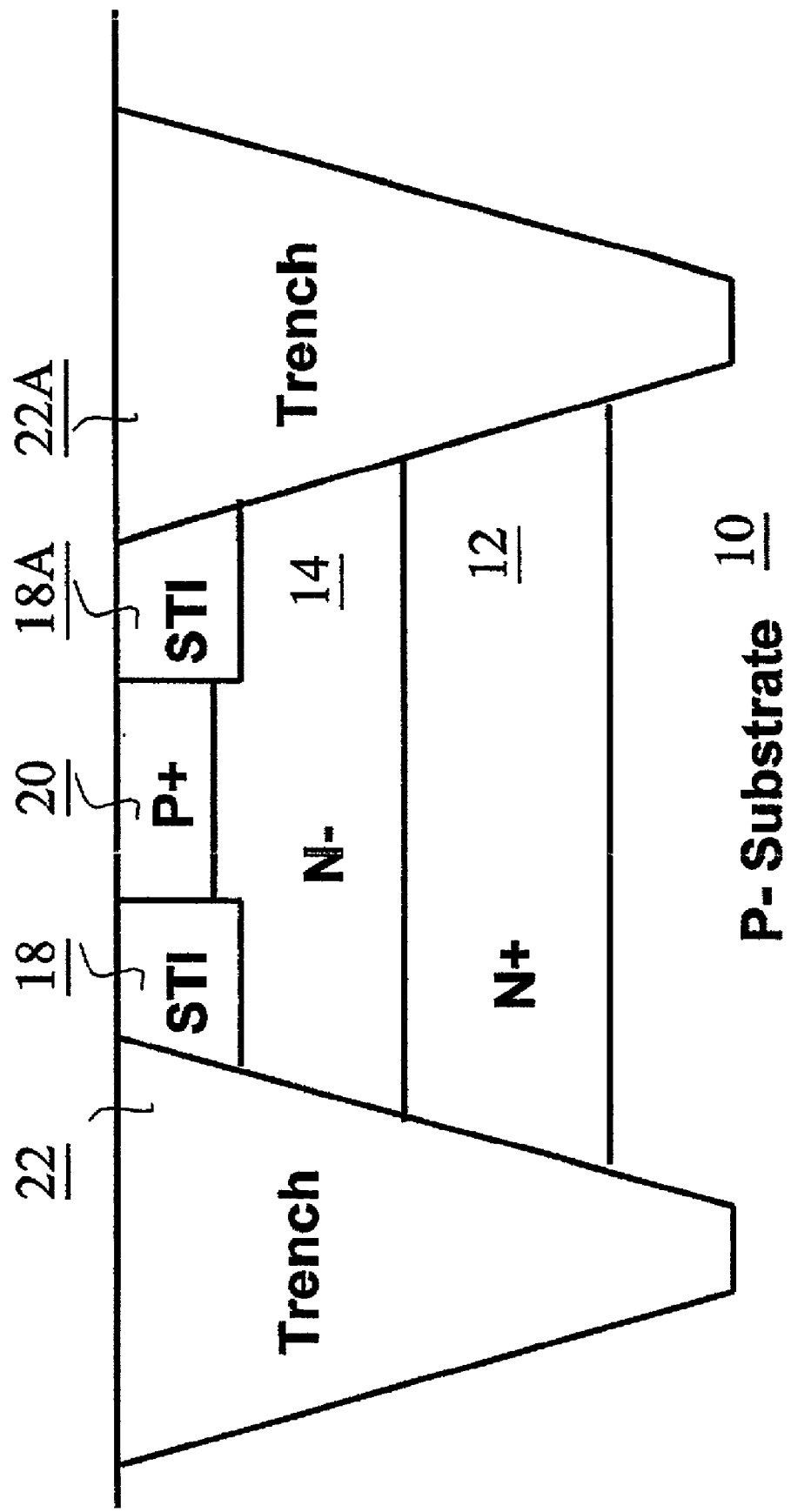
FIG. 3 is a cross-sectional view of an ESD diode in accordance with a third embodiment of the present invention.

FIG. 3 illustrates a third embodiment of the present invention. In FIG. 3, reference numerals that are the same as those used in FIG. 1 refer to structures that are the same as those depicted and described with reference to FIG. 1. Here, instead of vertical deep trenches, the invention utilizes tapered trenches 22, 24. The tapered trench is typically shallower than the deep trench structure due to the nature of the geometrical shape of the trench, and to minimize the width of the trench on the surface of the device. Tapered trenches tend to further reduce capacitance on the sidewalls of the diode, because of the geometrical shape of the trench sidewall on the anode side leads to a lower electrical field at the junction. This is understood since the charge stored on both sides of the junction are equal. Since the geometrical area of the tapered side of the p-n junction is wider, the electrical field is reduced on the sidewall. This translates to a lower sidewall capacitance. Additionally, tapering provides lower thermal resistance as compared to the vertical trenches, as well as lowering the current density (beveling geometrically reduces current density and the thermal resistance). The bevelled geometry leads to a widening of the area as one extends into the substrate region. As a result, the larger cross sectional area leads to a lower thermal resistance. The lower thermal impedance allows for the diode structure to reach a higher input power prior to reaching the melting temperature of the diode structure. This provides a more ESD robust structure. Finally, the tapered trenches reduce current injection to the substrate, reducing noise and increasing latchup immunity. The tapered trench extends well below standard "shallow trench isolation" or STI regions. STI regions are scaled every generation for density regions. The tapered trench allows for an improvement of the noise injection because minority carriers injected into the substrate do not diffuse to adjacent regions with the trench sidewall compared to an STI type isolation structure. In practice there are multiple methods for installation of the tapered isolation region. An embodiment used, the tapered isolation is implemented after all the other structures are formed in silicon and prior to contact formation. After definition of the CMOS and bipolar transistors steps, a glass is deposited over all the structures. At the "contact etch" step, a reactive ion etch (RIE) is done etching through the glass and penetration below the silicon surface. The tapered trench region must have adhesion liners to allow for the adhesion to the silicon surface. The tapered trench is then filled with a conformal material which adheres to the film, and does not lead to mechanical failure. Hence the tapered trench is typically a low temperature passivation with a thermal expansion coefficient similar to silicon materials. Passivation materials such as PSG, BPSG or other known glasses can be used. As discussed above in FIG. 1 and FIG. 2, it is possible to construct the structures with the tapered trench as shown in FIG. 3; this would require a device which is constructed closer to the surface using implantation, or require more silicon to provide a deep tapered trench structure.

Figure 4:
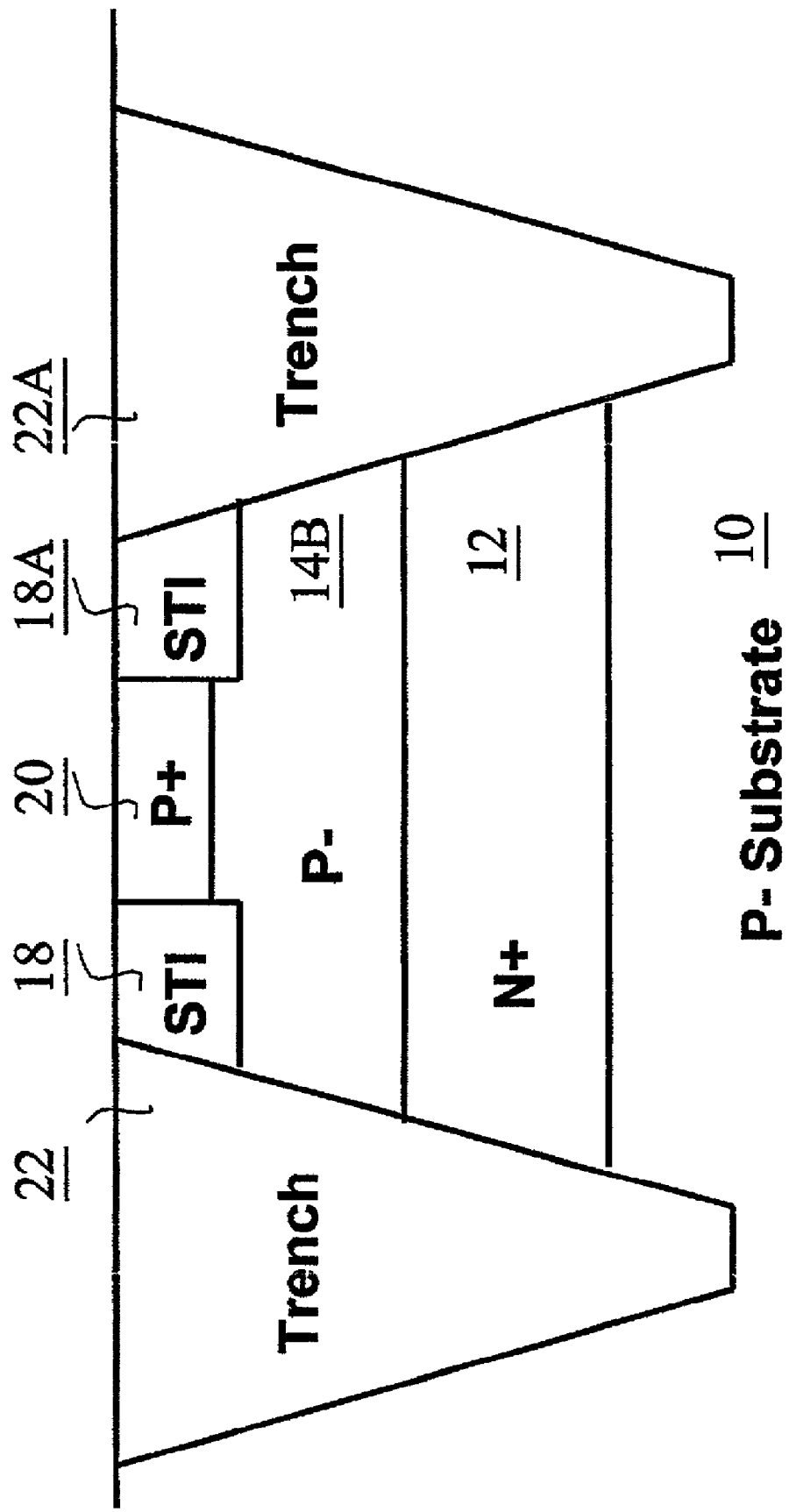
FIG. 4 is a cross-sectional view of an ESD diode in accordance with a fourth embodiment of the present invention.

FIG. 4 illustrates a fourth embodiment of the present invention. In FIG. 4, reference numerals that are the same as those used in FIG. 3 and FIG. 1 refer to structures that are the same as those depicted and described with reference to those figures. In this structure a p− region 14B is provided to enhance the performance of the ESD diode at higher voltages. This region 14B can be the p− epitaxial region of a base wafer or a compensated n− epitaxial region. As a practical matter this structure would be formed at the same time as the p-well implant when forming a BICMOS device (i.e. the well region for the NFETs), and is typically a retrograde implant that is more heavily doped in its lower portions and more lightly doped in its upper portions. Hence, to form this structure, only the low energy implant of p− material is allowed or the p-well higher dose implant is used for compensation of n type dopants. This implant further reduces charge injection to the substrate, while providing good latchup tolerance and reduced capacitance. This forms a p+/p−/n+ diode structure. Additionally, the formation of the metallurgical junctions are placed well below the structure surface to avoid salicide related ESD failure mechanisms, such as STI-pulldown salicide issues.

Figure 5:
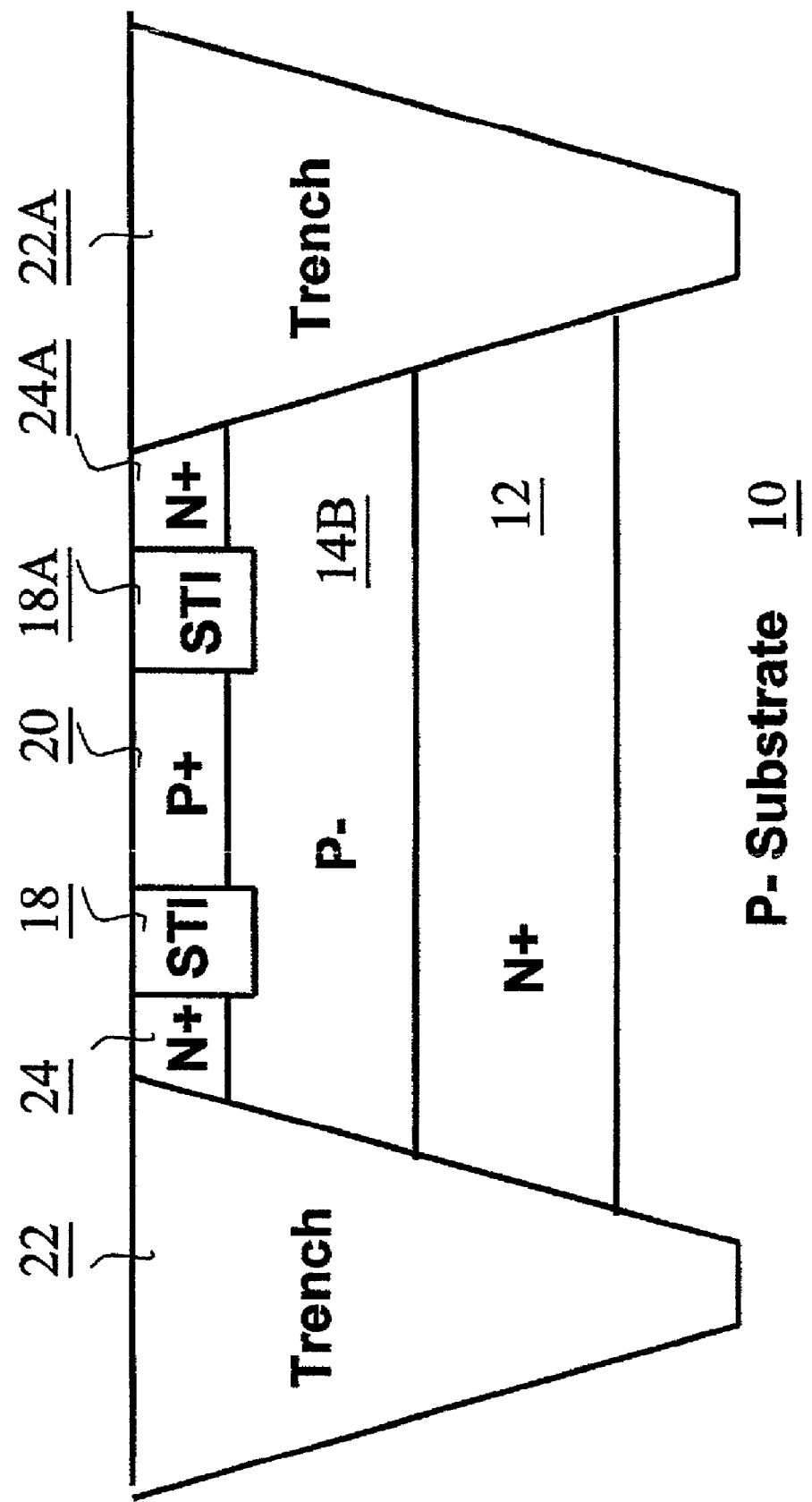
FIG. 5 is a cross-sectional view of an ESD diode in accordance with a fifth embodiment of the present invention.

FIG. 5 illustrates a fifth embodiment of the present invention. In FIG. 5, reference numerals that are the same as those used in FIG. 3 and FIG. 1 refer to structures that are the same as those depicted and described with reference to those figures. In this embodiment, n-type surface implant regions 24, 24A are integrated into the structure to provide two current paths out of diode. This can be used to make the ESD diode compatible with multiple power rails or a dual rail integrated circuit implementation. These implant regions 24, 24A would be formed after the p+ region 20 and prior to trenches 22, 22A, and in practice would be elongated (into the page) for contacting different power rails (not shown for ease of illustration). The surface implant regions 24 and 24A can be the n-channel MOSFET source/drain junction, a MOSFET extension implant, a BiCMOS reach-through implant or sinker implant used for bipolar transistors. In this structure, two diode metallurgical junctions are formed. As a result, this structure can have multiple cathodes using a single anode region. A circuit could be formed where each cathode can be the same power supply rail or a attached to a plurality of different power rails (e.g. VDD, VCC, VDD2, AVDD2) of a common power grid or different power grids in a single chip. This can utilized as well in the case of multiple grounds (e.g., VSS, VSS1, VSS2, AVSS).

Figure 6:
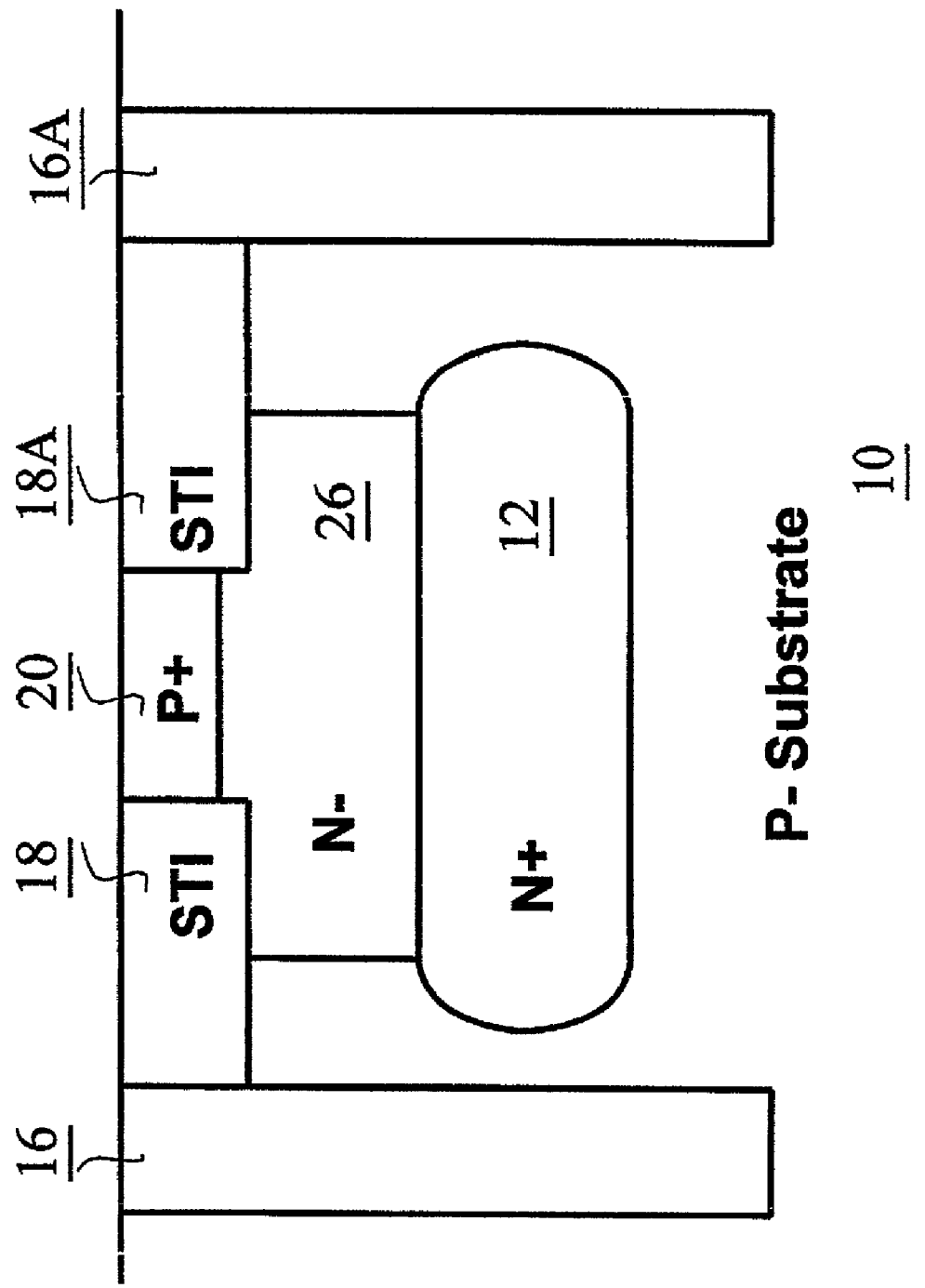
FIG. 6 is a cross-sectional view of an ESD diode in accordance with a sixth embodiment of the present invention.
Figure 7:
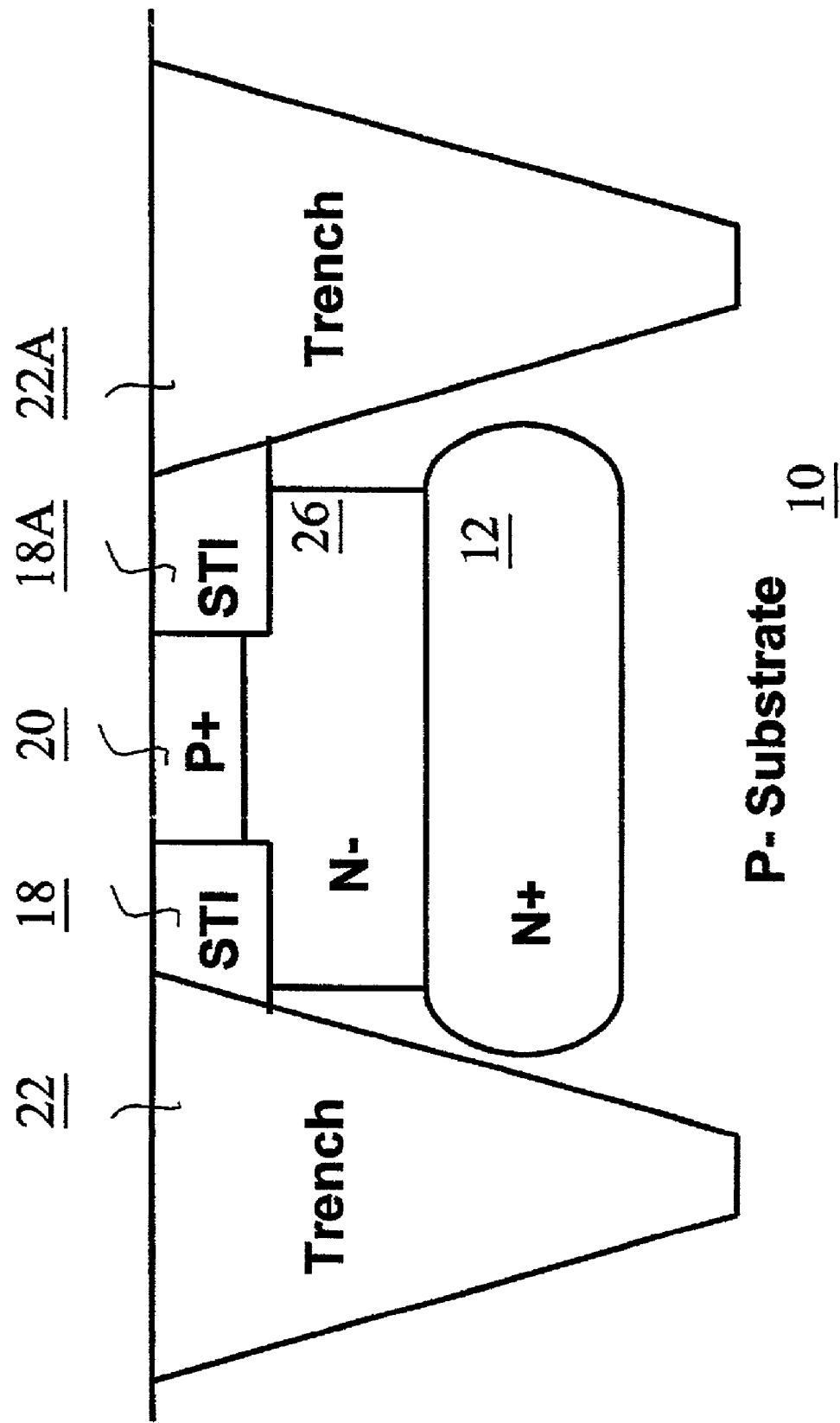
FIG. 7 is a cross-sectional view of an ESD diode in accordance with a seventh embodiment of the present invention.

FIG. 6 illustrates a sixth embodiment of the present invention. The presence of isolation structure increases the thermal impedance to the substrate. Hence it is an advantage to provide a diode structure which has improved latchup tolerance, noise tolerance, and a low thermal impedance. A structure which does not have the sidewall of the cathode abutting a deep trench structure will have a higher sidewall capacitance to the substrate and a larger area but will still provide superior latchup tolerance, noise tolerance and improved thermal impedance. In this structure, the subcollector sidewall region is displaced relative to the deep trench isolation structure. The spacing can be established so that the depletion region extends to the sidewall structure. This lowers the capacitance of the sidewall junction. Spacing can also be provided to allow for a lower thermal impedance by moving the isolation structure beyond the depletion width of the junction. FIG. 7 illustrates a seventh embodiment of the present invention, which is in effect the structures of FIG. 6 applies to a V-trench substrate.

In all of the embodiments of the invention depicted in FIGS. 1-7, region 20 is shown contained below the silicon surface and defined by the isolation regions 18 and 18A. These embodiments can also be constructed using a selective epitaxial deposited film where the epitaxial film is above the isolation structures 18 and 18A. The region 20 can be formed by diffusion of the dopants from the epitaxial film below the silicon surface as shown in the embodiments. A modification to these embodiment can include the case where the region 20 is above the silicon surface and the top surface of 18 and 18A. This epitaxial region can contain Silicon, Silicon Germanium, Silicon Germanium Carbon, GaN, or other known epitaxial films which could be formed above the surface as an anode region. The region 20 can be formed by outdiffusion or implantation into the epitaxial film. Implants such as BiCMOS Extrinsic base implants can be used to form region 20. In the case where the anode structure is not silicon, a heterojunction diode metallurgical region can be formed. In a heterojunction diode structure, the design can be optimized to provide a low capacitance junction region by modulation of the bandgap region. For example, the presence of Germanium in the metallurgical junction can modulate the barrier height, injection characteristics and capacitance. The Germanium concentration can be defined as to provide a low capacitance ESD junction diode structure. By adding Carbon to the diode structure, the diffusion of Boron can be constrained to prevent diode failure and dopant movement during and ESD event. ESD events generate thermal heating and the presence of Carbon in the diode region can reduce Boron outdiffusion. This improves the ESD robustness of the diode structure.

Moreover, in all of the embodiments of the invention depicted in FIGS. 1-7, above region 20, a salicide film can be placed to form a salicide film consisting of the base material (e.g. Silicon, Silicon Germanium, Silicon Germanium Carbon) and a refractory metal (e.g., Titanium, Titanium-Niobium, Cobalt) so as to form a low resistance anode structure. Masks can be used to place the salicide formation such that no ESD failure mechanism occurs in the structure to avoid STI-pulldown ESD salicide issues. Salicide blockage can be formed using known masking techniques, polysilicon gate structures, spacer structures, and other known methods to prevent salicidation. The inventor is motivated to have silicide formation on the structure to provide low resistance and current uniformity yet avoid edge related ESD failure mechanisms. Likewise, it is also clear that when the salicide penetration occurs vertically, or in the case of nonuniform lateral current spreading, the salicide can be removed in some segments or in the diode structures to provide improved ESD robustness to the diode structures. The inventor of the diode structures are also motivated to provide a low series resistance and use low sheet resistance salicide films with minimum penetration vertically into the diode structure.

Various other modifications may be made to the structures of the invention as set forth above without departing from the spirit and scope of the invention as described and claimed. Various aspects of the embodiments described above may be combined and/or modified. For example, in all of the described embodiments the anode is p-type and the cathode in n-type; obviously these could be interchanged. Other types of isolation structures could be used, so long as the provide the same general properties and benefits as the vertical trenches 16, 16A and the tapered trenches 22, 22A. Other implant regions could be provided in addition to those depicted.

What is claimed is:

1. A diode formed in a substrate having isolation regions, comprising an anode of a first conductivity type and a cathode of a second conductivity type disposed below said anode and in electrical contact with said substrate, wherein at least one of said cathode and anode comprise a plurality of vertically abutting diffusion regions, and wherein said cathode and anode are disposed between adjacent isolation regions that extend deeper into the substrate than said anode and said cathode, and further comprising a second pair of isolation structures disposed between said adjacent isolation regions and said anode.

2. The diode as recited in claim 1, wherein said isolation regions comprise a plurality of insulation-filled trenches having sidewalls that are substantially vertical.

3. The diode as recited in claim 1, wherein said isolation regions comprise a plurality of insulation-filled trenches having sidewalls that are tapered.

4. The diode as recited in claim 3, wherein said anode comprises a first doped region abutting said cathode and a second doped region on a surface of said substrate, said second doped region having a higher concentration of dopant than said first doped region.

5. The diode as recited in claim 4, wherein said first doped region comprises a retrograde-doped region.

6. The diode as recited in claim 3, further comprising a plurality of diffusion regions of said second conductivity type formed on a surface of said substrate.

7. The diode as recited in claim 6, wherein said plurality of diffusion regions are separated from said cathode by respective isolation regions.

8. The diode as recited in claim 1, wherein said cathode including a first doped region of a second conductivity type abutting said anode and a second doped region of said second conductivity type abutting and disposed below said first doped region and contacting said substrate, said first and second doped regions having different dopant concentrations.

9. The diode as recited in claim 8, wherein said cathode further comprises a third doped region disposed between said first doped region and said second doped region.

10. The diode as recited in claim 9, wherein said third doped region comprises a retrograde-doped region.

11. The diode as recited in claim 1, wherein said anode and said cathode form a pn junction bounded by said isolation regions.

12. The diode as recited in claim 11, wherein said cathode forms a pn junction with said substrate that is bounded by said plurality of isolation regions.

13. The diode as recited in claim 1, wherein said isolation regions comprise a plurality of insulating trenches having a depth not greater than approximately 5.5 microns.

14. The diode as recited in claim 13, wherein said plurality of insulating trenches are lined with a first material that does not produce dislocations in said substrate.

15. The diode as recited in claim 14, wherein said liner comprises silicon oxide.

16. The diode as recited in claim 14, wherein said plurality of insulating trenches are filled with a second material having a thermal expansion coefficient that does not damage said substrate.

17. The diode as recited in claim 16, wherein said second material is selected from the group consisting of polysilicon, PSG, and BPSG.

18. The diode as recited in claim 14, wherein said liner has a thickness of at least 100 Angstroms.

19. The diode as recited in claim 1 having transistors formed upon said substrate with switching speeds in excess of 1 GHz, said diode having a capacitance below 0.1 pF and a breakdown voltage of at least 500V.

20. A diode formed in a substrate having isolation regions, comprising an anode of a first conductivity type and a cathode of a second conductivity type disposed below said anode and in electrical contact with said substrate, wherein at least one of said cathode and anode comprise a plurality of vertically abutting diffusion regions, and wherein said cathode and anode are disposed between adjacent trench isolation regions that extend below a junction formed between a lower portion of said cathode and the substrate, and further comprising a second pair of isolation structures disposed between said adjacent trench isolation regions and said anode.

21. The diode as recited in claim 20, wherein said trench isolation regions have sidewalls that are substantially vertical.

22. The diode as recited in claim 20, wherein said trench isolation regions have sidewalls that are tapered.

23. The diode as recited in claim 21, wherein said cathode includes a first doped region of a second conductivity type abutting said anode and a second doped region of said second conductivity type abutting and disposed below said first doped region and contacting said substrate, said first and second doped regions having different dopant concentrations.

24. The diode as recited in claim 23, wherein said anode comprises a first doped region abutting said cathode and a second doped region on a surface of said substrate, said second doped region having a higher concentration of dopant than said first doped region.

25. A diode formed upon an original substrate, the diode comprising: an anode of a first conductivity type and a cathode of a second conductivity type disposed below said anode on said original substrate formed without removing any portion of said original substrate and without replacing with another substrate material, wherein at least one of said cathode and anode comprise a plurality of vertically abutting diffusion regions; a plurality of isolation regions formed in said original substrate, said cathode and anode being disposed between adjacent ones of said plurality of isolation regions, said plurality of isolation regions extending deeper into said original substrate than said cathode and said anode; and a plurality of isolation structures formed in said original substrate, each of said plurality of isolation structures disposed between and in direct contact with at least a portion of said anode and respective said adjacent ones of said plurality of isolation regions, said plurality of isolation structures extend to a depth less than that of said cathode.

* * * * *